United States Patent [19]

Benton et al.

[11] Patent Number: 5,079,454
[45] Date of Patent: Jan. 7, 1992

[54] TEMPERATURE COMPENSATED FET POWER DETECTOR

[75] Inventors: Robert H. Benton, Mountain View; Allen F. Podell, Palo Alto, both of Calif.

[73] Assignee: Pacific Monolithics, Sunnyvale, Calif.

[21] Appl. No.: 564,717

[22] Filed: Aug. 8, 1990

[51] Int. Cl.$^5$ .................... H03D 3/00; H03K 9/06
[52] U.S. Cl. .................... 307/522; 307/501; 307/304; 307/491; 328/140; 330/277
[58] Field of Search ............. 307/522, 304, 497, 491; 330/277, 286; 328/140

[56] References Cited

U.S. PATENT DOCUMENTS

| 4,110,700 | 8/1978 | Rosen et al. | 328/140 |
| 4,255,714 | 3/1981 | Rosen | 307/522 |
| 4,670,674 | 6/1987 | Kantorowicz et al. | 307/304 |
| 4,980,584 | 12/1990 | Goff et al. | 307/497 |
| 4,987,384 | 1/1991 | Yamanouchi et al. | 330/277 |

FOREIGN PATENT DOCUMENTS 0174806  8/1986  Japan ..................... 330/277

Primary Examiner—Timothy P. Callahan
Attorney, Agent, or Firm—Edward B. Anderson

[57] ABSTRACT

A detector for generating an output signal representative of the power of an input signal comprises an input capacitor coupled to receive the input signal for transmitting alternating current portions of the input signal. A first common-source FET pair have gate terminals coupled to a temperature-compensating circuit for varying the gate-to-source voltage. The drain of one FET is coupled through an intermediate capacitor to ground. That drain is also coupled to a relatively positive voltage source through a series-connected inductor and resistor. The drain of the second FET is also coupled to the voltage source through a resistor. An output capacitor couples the alternating current signal, at the junction between the resistor associated with the first transistor and the inductor, to ground. A differential amplifier and comparator generates an output signal representative of the difference between the signals appearing on the transistor sides of the two resistors.

8 Claims, 3 Drawing Sheets

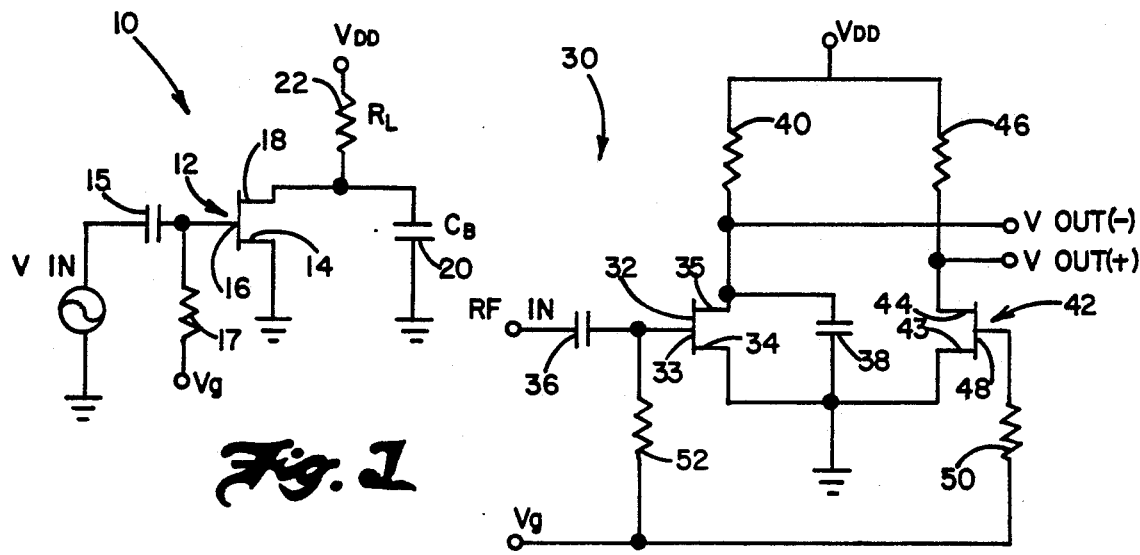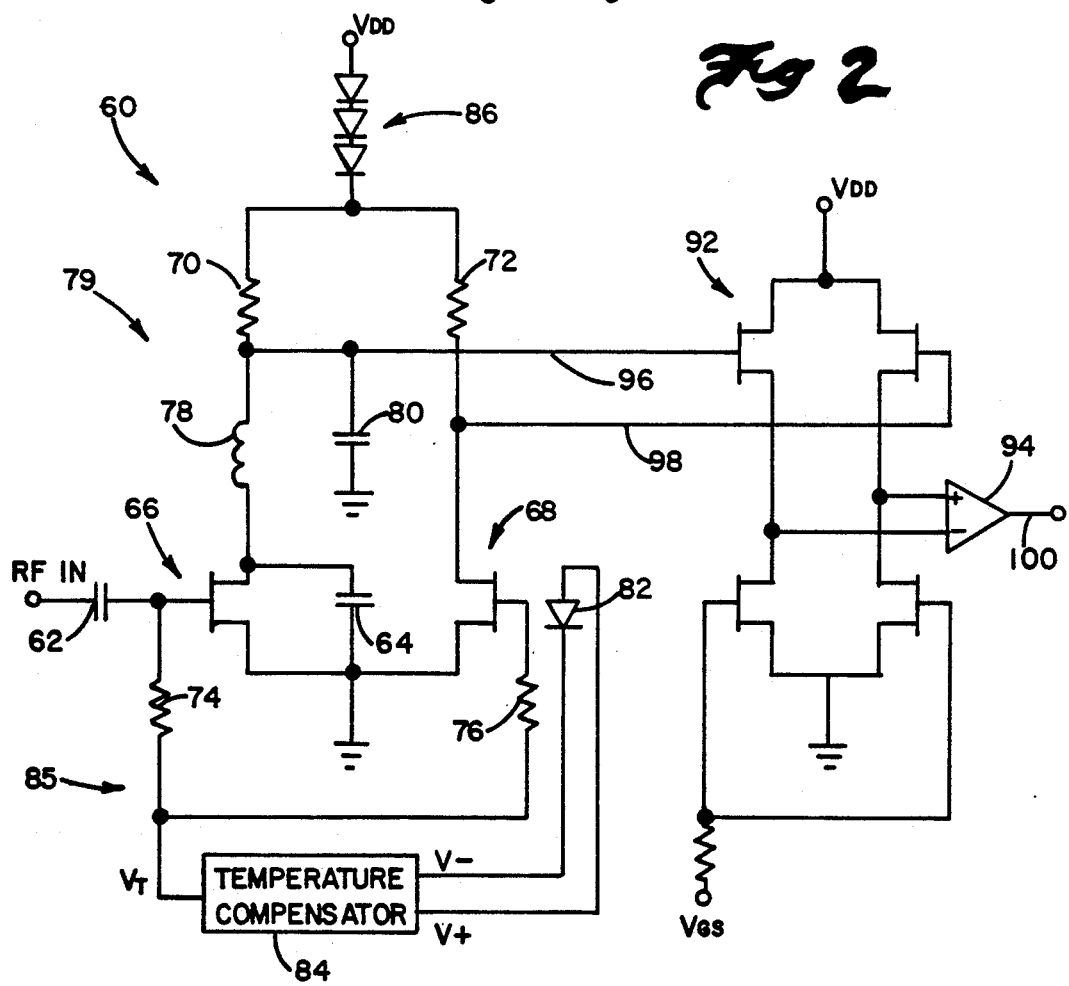

TEMPERATURE COMPENSATED FET POWER DETECTOR

FIELD OF THE INVENTION

This invention relates to monolithic detectors, and particularly to such detectors having an active element.

BACKGROUND AND SUMMARY OF THE INVENTION

Detectors, as the name implies, are used to detect a characteristic of a measurable phenomenon. In electrical circuits, particularly communication circuits, it is often desirable to measure the power, current, or voltage of a signal at an intermediate point between the signal source and destination.

In microwave applications, a directional coupler or signal divider is used to generate a secondary signal that is the same or proportionally the same as the primary signal. The power level, for instance, of this secondary signal is then measured to determine the power level of the primary signal.

Conventionally, diode detectors are used in a monolithic circuit. In its simplest form, this could be a rectifier, such as a diode, coupled to ground through a capacitor. The output signal is then taken between the diode and capacitor. These do produce a signal representative of the primary signal, but they function best at low voltages.

It is therefore desirable to have a detector that is functional over a broader range of voltages, as well as being constructable as a monolithic integrated circuit. Considering that microwave systems find use in many diverse environments, it is also desirable to have such a detector that compensates for any variations in circuit operation due to variations in the temperature of the components.

The present invention variously provides these features. In particular, the present invention provides a monolithic detector using an active device for generating an output signal representative of an A.C. input signal. This is accomplished by using the functional characteristics of active devices without relying on the use of rectifiers.

In its general form, the present invention provides a first transistor having a control terminal for receiving the input signal, and two current-conducting terminals. One current-conducting terminal is coupled to a first reference voltage. A first impedance couples the other current-conducting terminal to a second reference voltage. The first and second reference voltages are appropriate for biasing the first transistor in a manner generating a first output signal on the other current-conducting terminal. A first capacitor couples the other current-conducting terminal to the first reference voltage for removing alternating currents from the first output signal.

For lower signal level applications, a generator generates a control voltage on the control terminal of the first transistor. A second transistor has a control terminal coupled to the generator for receiving the control voltage. One of two current-conducting terminals of the second transistor is coupled to the first reference voltage. A second impedance couples the other current-conducting terminal of the second transistor to the second reference voltage. Thus, a second output signal is generated between the second impedance and the second transistor such that the difference between the first and second output signals represents the power of the input signal.

In the preferred embodiment of the invention, an input capacitor is coupled to receive the input signal for transmitting only an alternating current input signal. A first common-source FET pair have gate terminals coupled to a temperature-compensating circuit for varying the gate-to-source voltage to compensate for operation variations in the transistors due to temperature changes. The gate of one FET is coupled to the input capacitor. The drain of the one FET is coupled through an intermediate capacitor to ground. That drain is also coupled to a relatively positive voltage source through a series-connected inductor and resistor. The drain of the second FET is also coupled to the voltage source through a resistor. An output capacitor couples the alternating current signal at the junction between the resistor associated with the first transistor and the inductor to ground. A differential amplifier generates an output signal representative of the difference between the signals appearing on the transistor sides of the two resistors for driving a comparator. The comparator output signal is representative of the input signal power.

These and other features of the invention are apparent from the preferred embodiment disclosed in the following detailed description and the associated drawings.

BRIEF DESCRIPTION OF THE DRAWINGS

FIG. 1 is a circuit schematic of a basic detector made according to the invention.

FIG. 2 is a circuit schematic of the detector of FIG. 1 modified for low signal applications.

FIG. 3 is a circuit schematic of the preferred embodiment of the circuit of FIG. 2.

DETAILED DESCRIPTION OF THE PREFERRED EMBODIMENT

Figure 4:
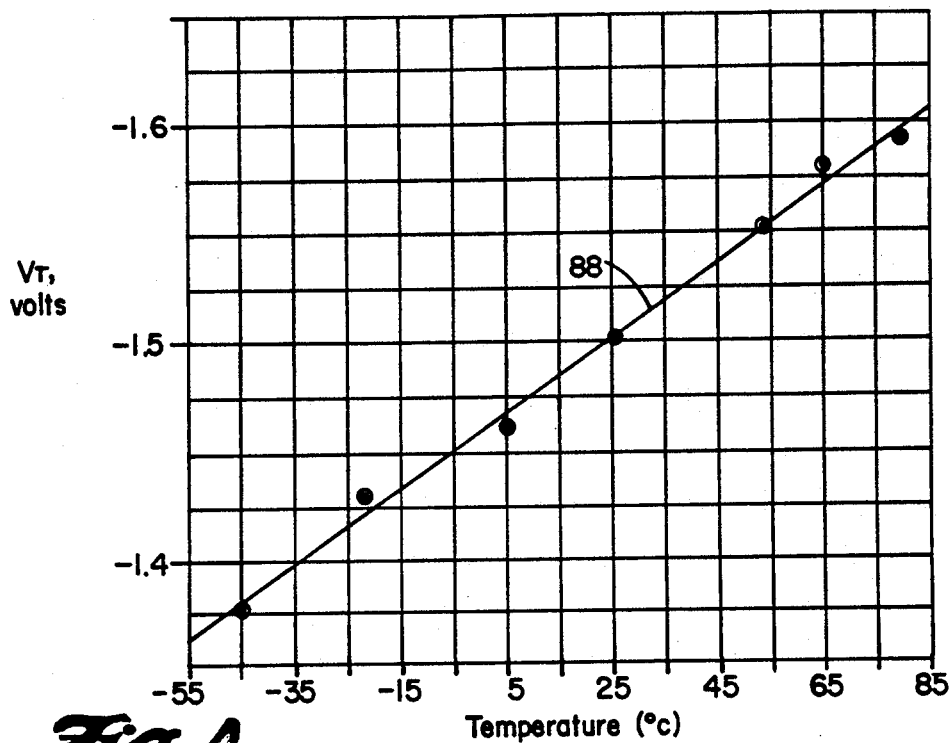
FIG. 4 is a plot of control voltage as a function of temperature for maintaining the efficiency of the detector of FIG. 3.

Referring initially to FIG. 1, the structure of a basic detector 10 made according to the invention is shown. The detector includes an FET 12 having a common source 14 and a gate terminal 16 connected to receive an input signal $V_{IN}$, the power level of which is to be detected. The input signal is fed in via a DC blocking input capacitor 15. A control voltage Vg is also applied to gate 16 via a control resistor 17 for biasing the transistor in a current-conducting state. The current-conducting drain terminal 18 is coupled to an output terminal P. This terminal is coupled to a first reference voltage, preferably ground, via a capacitor 20 ($C_B$), and to the drain supply voltage $V_{DD}$, also referred to as a second voltage reference, via a load or bias resistor 22 ($R_L$).

Operation of this circuit is based on a square law model as follows.

$$I_D = K(V_{IN} - V_P)^2 \tag{1}$$

where $I_D$ is the drain current, K is a proportionality constant determined by FET 12, $V_{IN}$ is the input signal, and $V_P$ is the voltage at terminal P.

$$V_{IN} = V_O + V_1 \sin \omega t \qquad (2)$$

$$I_D = K(V_O - V_P + V^1 \sin \omega t)^2 \qquad (3)$$

Let $(V_O - V_P) = V_{DC}$, then $$I_D = KV_{DC}^2 + 2KV_{DC}V_1 \sin \omega t + \tfrac{1}{2}KV_1^2 \tfrac{1}{2}KV_1^2 \cos 2\omega t \qquad (4)$$

In equation (4), $(KV_{DC}^2)$ is a DC offset term, $(2KV_{DC}V_1\sin\omega t)$ is a fundamental term, $(\tfrac{1}{2}KV_1^2)$ is the detected power term, and $(\tfrac{1}{2}KV_1^2 \cos 2\omega t)$ is the second harmonic term. The detected power term is proportional to the square of the RF (radio frequency) current. The detected DC current and DC offset current flow through $R_L$, so $R_L$ controls the detection efficiency: output current/input power.

The speed of the detector is dependent on the $R_L G_B$ time constant. As will be seen, there is a tradeoff between pulse response and detection efficiency. A faster response time means lower detection efficiency. An exemplary high speed detector has 15 mA of bias current, and a variable efficiency detector has 600 μA of bias current.

For small input power levels, the DC offset becomes larger compared with the detected DC current. This is found to typically happen at −3 dBm. To extend the range down further, the differential detector 30 shown in FIG. 2 is used. Detector 30 is similar to detector 10 as regards an input FET 32 having a gate 33, source 34 coupled to ground, and a drain 35. The gate receives the input RF signal via a DC blocking input capacitor 36. The drain is coupled to ground via an intermediate capacitor 38, and is coupled to the drain voltage supply via biasing resistor 40.

Additionally, a second, DC-conducting FET 42 also has a common source 43 and a drain 44 coupled to the drain voltage supply via biasing resistor 46. The gate 48 of FET 42 and gate 33 of FET 32 are coupled to gate bias control voltage supply $V_g$, via respective control resistors 50 and 52. As will be seen, variation of the value of $V_g$ is used to vary the detector efficiency or to compensate for operational variations due to variations in component temperatures.

The output of detector 30 is taken as the difference between the voltages, $V_{OUT}(-)$ and $V_{OUT}(+)$, existing between the respective FET drains and associated biasing resistors. The voltage $V_{OUT}(+)$ is independent of the input RF signal. Ideally, FETs 32 and 42 are identical, in which case the differential output is directly proportional to the RF input power.

A detailed circuit schematic of a preferred detector 60, based on detector 30, is shown in FIG. 3. Detector 60 includes capacitors 62 and 64, FETs 66 and 68, drain-biasing resistors 70 and 72, and gate-biasing resistors 74 and 76, all similar to corresponding elements of detector 30. Additionally, an inductor 78 is in series between the drain of FET 66 and resistor 70. Inductor 78 and bypass capacitor 80 are also included to reduce the ripple inherent in the detector output. Resistor 70 and inductor 78 are also referred to generally as an impedance 79.

A temperature sensitive diode 82 generates a signal representative of the temperature of FETs 66 and 68 for input into a temperature compensator 84. The compensator then generates a gate-bias voltage, $V_T$, appropriate to compensate for variations in the FET function due to changes in temperature. Resistors 74 and 76, diode 82, and compensator 84 thus function as what may be referred to as a control means 85.

A set of diodes 86 between resistors 70 and 72 provide appropriate voltage drop so that the same voltage supply can be used for the basic detector circuit and a line driver 92, described below.

Figure 5:
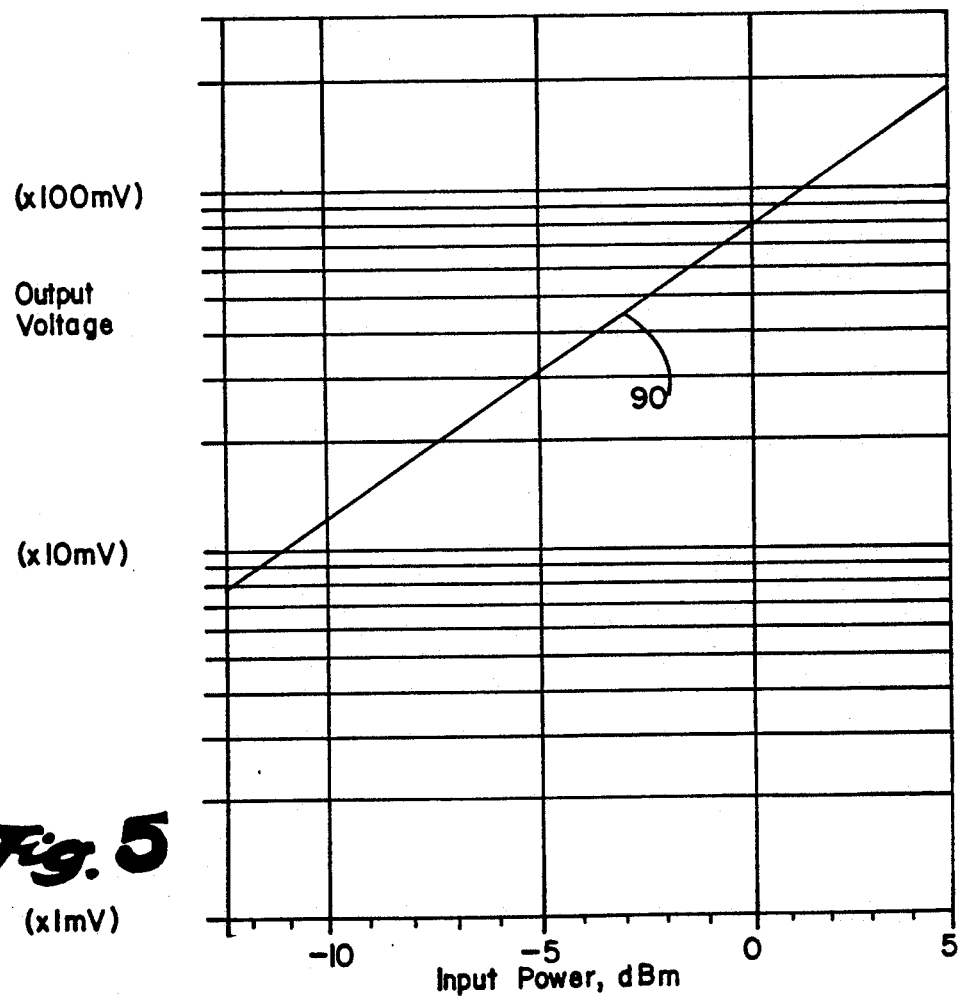
FIG. 5 is a plot of output voltage as a function of input power compensated for the range of temperatures shown in FIG. 4.

The curve 88 plotted in FIG. 4 represents the temperature-compensation voltage required for temperatures between 55° C. and 85° C. Using these compensating voltages, the curve 90 plotted in FIG. 5 shows the temperature compensated detection efficiency: output voltage as a function of input power. For a range of input power between 15 dBm to +10 dBm, a corresponding output voltage ranging from about 8 mV to 200 mV is detected. Although it is not immediately apparent from the curve, every even two dBm of input power has three plotted output voltage values, one each for a temperature of −55° C., 25° C. and 85° C. It is thus apparent that with temperature compensation, the detection efficiency is relatively constant for a given input power level. The detection efficiency is a function of gate bias, and falls off near pinch off and peaks around −1 v.

Detector 60 also includes a source-follower line driver 92 for driving the highly capacitive load of a comparator 94. From the differential signal on conductors 96 and 98, the line driver and capacitor produce a single output signal on conductor 100 that is representative of the input signal power.

Figure 6:
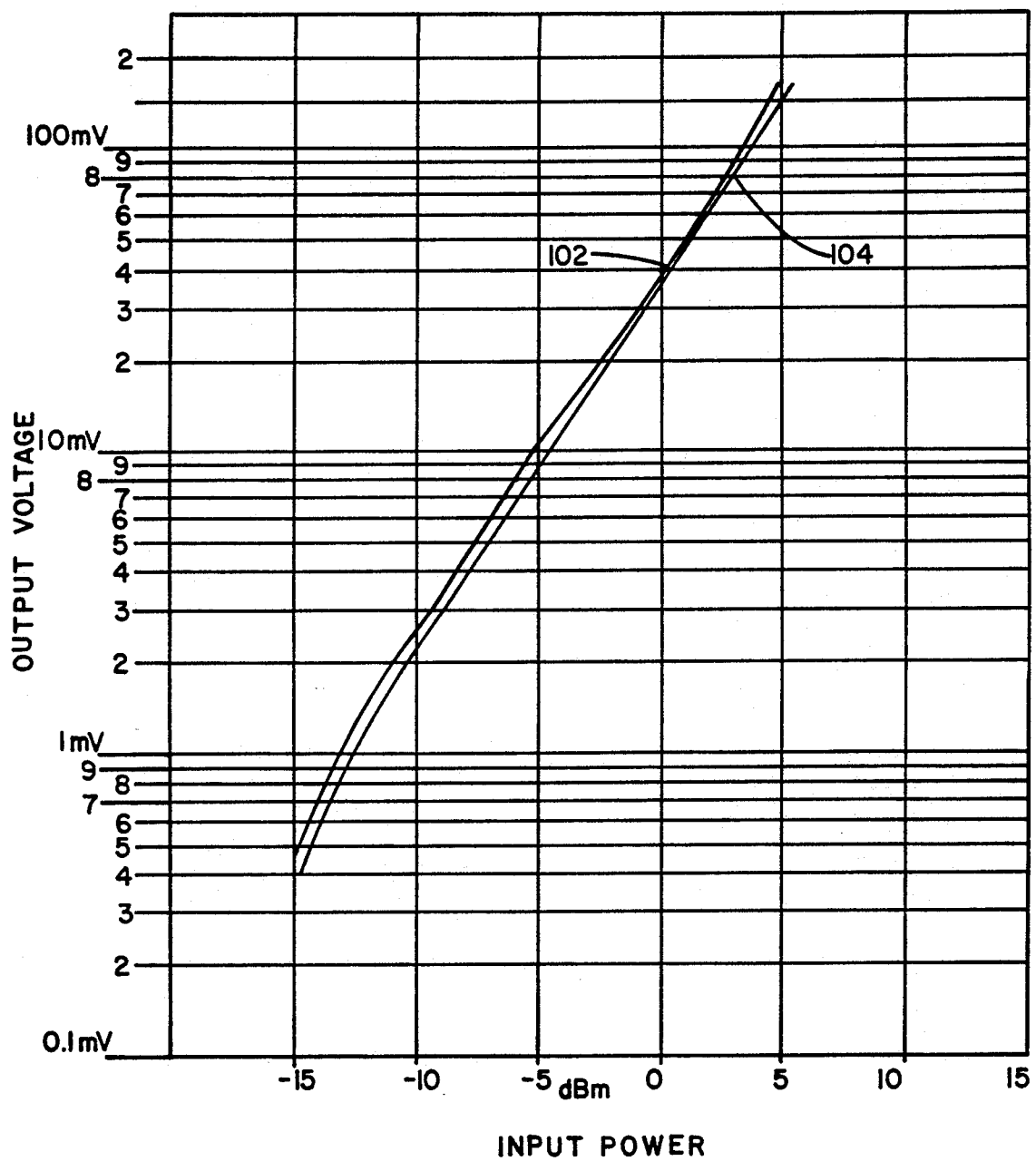
FIG. 6 is a plot of output voltage as a function of input power for a range of operating frequencies.

FIG. 6 shows the response of detector 60 with frequency variation. Upper curve 102 shows the response when the input signal has a frequency of 9.1 GHz. The lower curve 104 shows the response for an input signal frequency of 6.9 GHz. Within this frequency range the response is relatively constant.

There is thus shown a detector that uses active elements and may be constructed as a monolithic IC. It is temperature compensated and can be made to operate at high speed or have constant efficiency by appropriate selection of component sizes. Moreover, it presents a light capacitive load to the input signal and remains a linear power detector to +10 dBm.

Although the invention has been described with reference to a preferred embodiment, it will be understood by those skilled in the art that variations and changes in form and design may be made without varying from the spirit and scope of the invention as described in the claims.

We claim:

1. A detector for generating an output signal representative of an input signal comprising:
   first detection transistor means having a control terminal for receiving the input signal, and two current-conducting terminals, one current-conducting terminal being coupled to a first reference voltage;
   control means for applying a control voltage on the control terminal of the first transistor means for biasing the first transistor means in a current-conducting state;
   first impedance means coupling the other current-conducting terminal to a second reference voltage;
   the first and second reference voltages being appropriate for biasing the first transistor means in a manner generating a first output signal between the first impedance means and the other current-conducting terminal representative of the input signal; and first capacitance means directly connecting the other current-conducting terminal to the first reference voltage for removing alternating current from the first output signal.

2. A detector for generating an output signal representative of an input signal comprising:

first transistor means having a control terminal for receiving the input signal, and two current-conducting terminals, one current-conducting terminal being coupled to a first reference voltage;

control means for applying a control voltage on the control terminal of the first transistor means for biasing the first transistor means in a current-conducting state;

first impedance means coupling the other current-conducting terminal to a second reference voltage;

the first and second reference voltages being appropriate for biasing the first transistor means in a manner generating a first output signal between the first impedance means and the other current-conducting terminal;

first capacitance means coupling the other current-conducting terminal to the first reference voltage for removing alternating current from the first output signal;

second transistor means having a control terminal coupled to the control means for receiving the control voltage, and two current-conducting terminals, one current-conducting terminal being coupled to the first reference voltage; and second impedance means coupling the other current-conducting terminal of the second transistor means to the second reference voltage;

whereby a second output signal is generated between the second impedance means and the second transistor means such that the difference between the first and second output signals represents the power of the input signal.

3. A detector according to claim 2 wherein the first impedance means comprises inductance means and resistor means coupled in series, whereby the first output signal is generated between the resistor means and the inductance means.

4. A detector according to claim 3 further comprising second capacitance means coupling the first output signal to the first reference voltage for removing alternating currents from the first output signal.

5. A detector according to claim 4 wherein the first and second transistor means vary the first and second output signals as a function of the temperature of the first and second transistor means, and the control means is responsive to the temperature of the first and second transistor means for generating the control voltage appropriately for compensating for the variation in the first and second output signals due to the variation in temperature of the first and second transistor means.

6. A detector according to claim 5 further comprising comparator means responsive to the first and second output signals for generating a third output signal representative of the difference between the first and second output signals.

7. A detector for generating an output signal representative of an input signal comprising:

first transistor means having a control terminal for receiving the input signal, and two current-conducting terminals, one current-conducting terminal being coupled to a first reference voltage;

control means for applying a control voltage on the control terminal of the first transistor means for biasing the first transistor means in a current-conducting state;

first impedance means coupling the other current-conducting terminal to a second reference voltage;

the first and second reference voltages being appropriate for biasing the first transistor means in a manner generating a first output signal between the first impedance means and the other current-conducting terminal;

first capacitance means coupling the other current-conducting terminal to the first reference voltage for removing alternating current from the first output signal; the first transistor means varying the first output signal as a function of the temperature of the first transistor means, and the control means being responsive to the temperature of the first transistor means for generating the control voltage appropriately for compensating for the variation in the first output signal due to the variation in temperature of the first transistor means.

8. A detector for generating an output signal representative of an input signal comprising:

input capacitance means coupled to receive the input signal for transmitting alternating current portions of the input signal;

first FET means having a gate terminal coupled to the input capacitance means for receiving only the alternating current portions of the input signal, and a source terminal connected to ground;

first resistor means coupling a drain terminal of the first FET means to a positive reference voltage;

first capacitance means coupling the drain terminal of the first FET means to ground for removing alternating currents from the first output signal;

control means coupled to the gate terminal of the first FET means for applying a control voltage on the control terminal of the first FET means;

second FET means having gate, source and drain terminals, the source terminal being coupled to ground;

second resistor means coupling the drain terminal of the second FET means to the positive reference voltage;

whereby the positive reference voltage is appropriate for biasing the first and second FET means in a manner generating first and second output signals between the respective drain terminals and resistor means, such that the difference between the first and second output signals represents the power of the input signal;

inductance means coupled between the first resistance means and the first FET means, whereby the first output signal is generated between the first resistor means and the inductance means;

second capacitance means coupling the first output signal to ground for reducing alternating currents in the first output signal;

the first and second FET means varying the first and second output signals as a function of the temperature of the first and second FET means;

the first and second FET means varying the first and second output signals in response to variations in the temperature of the first and second output means, and the control means being responsive to the temperature of the first and second FET means for generating the control voltage appropriately for compensating for the variation in the first and second output signals due to the variation in temperature of the first and second FET means; and comparator means responsive to the first and second output signals for generating a third output signal representative of the difference between the first and second output signals.

* * * * *